(12) United States Patent
Azarmnia et al.

(10) Patent No.: US 11,909,356 B2
(45) Date of Patent: Feb. 20, 2024

(54) TUNABLE DISTRIBUTED OSCILLATOR (71) Applicant: Marvell Asia Pte Ltd, Singapore (SG)

(72) Inventors: Morteza Azarmnia, Irvine, CA (US); Tomas Dusatko, North Vancouver (CA); Fazil Ahmad, Irvine, CA (US); Marco Garampazzi, Pavia (IT)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/807,426

(22) Filed: Jun. 17, 2022

(65) Prior Publication Data
US 2022/0407458 A1 Dec. 22, 2022

Related U.S. Application Data (60) Provisional application No. 63/282,595, filed on Nov. 23, 2021, provisional application No. 63/212,477, filed on Jun. 18, 2021.

(51) Int. Cl.
*H03B 5/18* (2006.01)
*G06F 1/10* (2006.01)

(52) U.S. Cl.
CPC ............. *H03B 5/1852* (2013.01); *G06F 1/10* (2013.01)

(58) Field of Classification Search
CPC .. H03B 5/1841; H03B 5/1847; H03B 5/1852; H03K 5/15; H03K 5/15013; H03K 5/1502; H03K 5/15006; H03K 5/1506; H03K 5/1508; G06F 1/10; H03L 7/04
See application file for complete search history.

(56) References Cited

U.S. PATENT DOCUMENTS 7,538,603 B2 * 5/2009 Ikeda ................... H03B 5/1841
327/565

OTHER PUBLICATIONS

Chien, Jun-Chau, and Liang-Hung Lu. "Design of wide-tuning-range millimeter-wave CMOS VCO with a standing-wave architecture." IEEE Journal of Solid-State Circuits 42.9 (2007): 1942-1952. (Year: 2007).*
Chen, Y.-J., et al., "A Two-Dimensional Direct-Coupled Standing-Wave Oscillator Array," *IEEE MTTS International Microwave Symposium Digest*, pp. 1-3 (2013).

(Continued)

*Primary Examiner* — Ryan Johnson (57) ABSTRACT

An integrated circuit transceiver device includes a plurality of functional circuits, and clock circuitry for distributing synchronous, in-phase, phase-locked clock signals to all transceiver circuits. The clock circuitry includes a frequency-controllable distributed oscillator including at least one coupled pair of transmission line oscillators having a respective oscillator core, and at least one respective transmission line segment. At least one impedance element couples the at least one respective transmission line segment of a first transmission line oscillator to the at least one respective transmission line segment of a second transmission line oscillator. Impedance of the impedance element is different from impedance of each respective transmission line segment to cause reflection at the at least one impedance element. At least one tap corresponding to each respective one of the transmission line oscillators outputs synchronous, in-phase, phase-locked clock signals for the functional circuits at points along the distributed oscillator.

16 Claims, 10 Drawing Sheets

(56) References Cited

OTHER PUBLICATIONS

Chen, Y.-J., et al., "2-D Direct-Coupled Standing-Wave Oscillator Arrays," *IEEE Transactions on Microwave Theory and Techniques*, vol. 61, No. 12, pp. 4472-4482 (2013).
Chu C.-Y. et al., "A Fully-Integrated Ka-Band 4TX/4RX Phased-Array Transceiver IC in 65nm CMOS," *IEEE International Symposium on Radio-Frequency Integration Technology (RFIT)*, pp. 1-3 (2016).
Saeidi, H. et al., "29.9 A 4x4 Distributed Multi-layer Oscillator Network for Harmonic Injection and THz Beanforming with 14dBm EIRP at 416GHz in a Lensless 65nm CMOS IC," *IEEE International Solid-State Circuits Conference—(ISSCC)*, pp. 256-258 (2020).
Chien, J.-C., et al., "Design of Wide-Tuning-Range Millimeter-Wave CMOS VCO With a Standing-Wave Architecture," *IEEE Journal of Solid-State Circuits*, vol. 42, No. 9, pp. 1942-1952 (2007).
LaRocca, T., et al., "Millimeter-Wave CMOS Digital Controlled Artificial Dielectric Differential Mode Transmission Lines for Reconfigurable ICs," *2008 IEEE MTT-S International Microwave Symposium Digest*, pp. 181-184 (2008).
Mirzaei, A., et al., "Analysis of Oscillators Locked by Large Injection Signals: Generalized Adler's Equation and Geometrical Interpretation," *IEEE Custom Integrated Circuits Conference (CICC)*, pp. 737-740 (2006).
Nomiyama, Y., et al., "Low-Impedance and High-Q Transmission Line for mmw VCO," *2009 IEEE Workshop on Signal Propagation on Interconnects*, pp. 1-4 (2009).
O'Mahony, F., et al., "10GHz Clock Distribution Using Coupled Standing-Wave Oscillators," *IEEE International Solid-State Circuits Conference*, Paper 24.4, pp. 1-10 (2003).

\* cited by examiner

TUNABLE DISTRIBUTED OSCILLATOR

CROSS REFERENCE TO RELATED APPLICATION

This disclosure claims the benefit of, commonly-assigned U.S. Provisional Patent Applications Nos. 63/212,477 and 63/282,595, filed Jun. 18, 2021 and Nov. 23, 2021, respectively, each of which is hereby incorporated by reference herein in its respective entirety.

FIELD OF USE

This disclosure relates to a tunable distributed oscillator. More particularly, this disclosure relates to coupling transmission line oscillators to deliver synchronous, in-phase, phase-locked clock signals to all functional circuits of an integrated circuit device having multiple functional circuits, such as a multi-transceiver network switching device.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

As an example, switching devices for networking are very large and include a plurality of transceivers on a single integrated circuit device, or in a plurality of chiplets coupled to the integrated circuit. Such switching devices may require synchronous low-jitter high-frequency clocks at locations that are physically distant on the integrated circuit device, or that are distributed among the integrated circuit and coupled chiplets. This may be particularly important for some optical networking devices that electrically process a plurality of optical data streams that must remain coherent. But even in the case of a purely electrical switch, there can be as many as 100 or more transceivers on a single integrated circuit device. While clock-tree techniques (e.g., H-trees) may be used to distribute synchronous clocks throughout a device, the long distances that clock signals must travel to traverse an H-tree, as well as the high-frequencies of currently-used devices, increase power demands on the device. Moreover, as die size increases in integrated circuits, H-tree complexity, and the amount of wiring required for H-trees, increase, which adds to design challenges and potentially reduces the area available on a device for functional circuitry.

SUMMARY

In accordance with implementations of the subject matter of this disclosure, an integrated circuit transceiver device includes a plurality of functional circuits, each functional circuit being disposed at a different spatial location of the integrated circuit transceiver device, and clock circuitry for distributing synchronous, in-phase, phase-locked clock signals to all transceiver circuits in the plurality of transceiver circuits. The clock circuitry includes a frequency-controllable distributed oscillator configured to generate a clock signal, the distributed oscillator including at least one coupled pair of transmission line oscillators, each transmission line oscillator having a respective oscillator core, and at least one respective transmission line segment, at least one impedance element coupling the at least one respective transmission line segment of a first transmission line oscillator in the pair of transmission line oscillators to the at least one respective transmission line segment of a second transmission line oscillator in the pair of transmission line oscillators, impedance of the at least one impedance element being different from impedance of each of the at least one respective transmission line segment to cause reflection at the at least one impedance element, and at least one tap corresponding to each respective one of the transmission line oscillators, each tap being configured to output synchronous, in-phase, phase-locked clock signals for the functional circuits at points along the distributed oscillator.

A first implementation of such an integrated circuit transceiver device may further include a respective controllable capacitance element configured to tune each respective transmission line segment to a respective electrical length corresponding to a quarter-wave of a target frequency.

According to a first aspect of that first implementation, the at least one impedance element may include a switch configured to controllably establish, when closed, a null in a standing wave of its respective transmission line oscillator to control an oscillation mode of its respective transmission line oscillator.

In a first instance of that first aspect, the at least one respective transmission line segment may include at least one additional transmission line segment. The integrated circuit transceiver device may further include a respective additional impedance element coupling each additional transmission line segment to an adjacent transmission line segment in the pair of transmission line oscillators.

In a variant of that first instance, each coupled pair of transmission line oscillators may further include a respective additional controllable capacitance element configured to tune a respective additional transmission line segment to an electrical length corresponding to a selectable fractional portion of a wavelength corresponding to the target frequency.

In a second instance of the first aspect, each coupled pair of transmission line oscillators may further include a midpoint switch at a midpoint between the respective oscillator cores of the transmission line oscillators in the coupled pair of transmission line oscillators, the midpoint switch being configured to controllably establish, when closed, a null in a standing wave of the coupled pair of transmission line oscillators to control an additional oscillation mode of the coupled pair of transmission line oscillators.

In a second implementation of such an integrated circuit transceiver device, the at least one impedance element may include a plurality of switches in each transmission line oscillator in the pair of transmission line oscillators, each respective switch in the plurality of switches being configured to controllably establish at its respective location, when closed, the null in the standing wave of its respective transmission line oscillator to control the oscillation mode of its respective transmission line oscillator.

According to a first aspect of that second implementation, the plurality of switches in each transmission line oscillator in the pair of transmission line oscillators may be configured to controllably establish, when two adjacent ones of the plurality of switches are closed, the null in the standing wave of the respective transmission line oscillator at an interpolated position between the two adjacent ones of the switches.

In a third implementation of such an integrated circuit transceiver device, the distributed oscillator may include a plurality of coupled pairs of transmission line oscillators, each of the coupled pairs of transmission line oscillators being chained to an adjacent one of the coupled pairs of transmission line oscillators at one of its oscillator cores, and the taps may be configured at oscillator cores in the distributed oscillator to output the synchronous, in-phase, phase-locked clock signals.

According to a first aspect of that third implementation, output of each respective coupled pair of transmission line oscillators may be directed to a respective channel of the integrated circuit transceiver device.

According to a second aspect of that third implementation, each oscillator core that is at an end of a first coupled pair of transmission line oscillators that is adjacent an end of a second coupled pair of transmission line oscillators may be coupled to an oscillator core in the second coupled pair of transmission line oscillators.

According to a third aspect of that third implementation, each oscillator core that is at an end of a first coupled pair of transmission line oscillators that is adjacent an end of a second coupled pair of transmission line oscillators may be part of the first coupled pair of transmission line oscillators and of the second coupled pair of transmission line oscillators.

In accordance with implementations of the subject matter of this disclosure, a method of distributing synchronous, in-phase, phase-locked clock signals to functional circuits in an integrated circuit transceiver device, includes generating a standing wave oscillation at a selectable target frequency in a distributed oscillator including at least one coupled pair of transmission line oscillators, each transmission line oscillator having a respective oscillator core, and at least one respective transmission line, where the at least one respective transmission line of a first transmission line oscillator in the pair of transmission line oscillators is coupled to the at least one respective transmission line of a second transmission line oscillator in the pair of transmission line oscillators, tuning the at least one respective transmission line to an electrical length corresponding to a quarter-wave of the target frequency using a controllable capacitance element, controlling an impedance element to control an oscillation mode of the distributed oscillator, and coupling the transceivers to taps at points along the distributed oscillator.

A first implementation of such a method may further include coupling at least one additional transmission line segment between the at least one transmission line segment of the first transmission line oscillator in the pair of transmission line oscillators and the at least one transmission line segment of the second transmission line oscillator in the pair of transmission line oscillators, and tuning the transmission line segments to an electrical length corresponding to a selectable fractional portion of a wavelength corresponding to the target frequency.

In a second implementation of such a method, controlling the impedance element to control an oscillation mode of the distributed oscillator may include closing a switch to establish a null in a standing wave of the coupled pair of transmission line oscillators.

According to a first aspect of that second implementation, closing the switch may include closing one of a plurality of switches to establish a null in a standing wave of the coupled pair of transmission line oscillators at a location corresponding to the one of the plurality of switches.

According to a second aspect of that second implementation, closing the switch may include closing a plurality of switches to establish a plurality of nulls in a standing wave of the coupled pair of transmission line oscillators at locations corresponding to the plurality of switches.

According to a third aspect of that second implementation, closing the switch may include closing at least two of a plurality of switches to establish a null in a standing wave of the coupled pair of transmission line oscillators at an interpolated location between locations of the two of the plurality of switches.

In a third implementation of the subject matter of this disclosure, controlling the impedance element to establish a null in a standing wave of its respective transmission line oscillator to control an oscillation mode of its respective transmission line oscillator may include closing a switch at a midpoint between the respective oscillator cores of the transmission line oscillators in the coupled pair of transmission line oscillators, to establish a null, located at the midpoint, in a standing wave of the coupled pair of transmission line oscillators.

A fourth implementation of the subject matter of this disclosure may further include chaining a plurality of coupled pairs of transmission line oscillators, each of the coupled pairs of transmission line oscillators being chained to an adjacent one of the coupled pairs of transmission line oscillators at one of its oscillator cores.

A first aspect of that fourth implementation may further include directing output of each respective coupled pair of transmission line oscillators to a respective channel of the multi-transceiver integrated circuit.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Integrated circuits may include numerous functional circuits disposed at remote locations. For example, as noted above, switching devices for networking include a plurality of transceivers on a single integrated circuit device. Such switching devices may require synchronous low-jitter high-frequency clocks at locations that are physically distant on the integrated circuit device. This may be particularly important for optical networking devices that electrically process a plurality of optical data streams that must remain coherent. But even in the case of a purely electrical switch, there can be as many as 100 or more transceivers on a single integrated circuit device. While clock-tree techniques (e.g., H-trees) may be used to distribute synchronous clocks throughout a device, the long distances that clock signals must travel to traverse an H-tree, as well as the high-frequencies of currently-used devices, increase power demands on the device. The same is true for any integrated circuit device having multiple functional circuits to which clocks must be distributed.

Instead, in accordance with implementations of the subject matter of this disclosure, rather than generating a clock centrally and using an H-tree or other tree structure to distribute the clock, which, even though it maintains synchronization and phase relationships of the clocks, consumes substantial power, the central clock generation is replaced by distributed clock generation using transmission-line oscillators, in which the structure that distributes the clock signal also serves as the inductance for the oscillator, reducing or eliminating the need for separate distribution structures. In a transmission-line oscillator, inductance is provided by the transmission line itself, so conventional inductors are not needed, and the oscillator core, which may be any circuit that provides gain (or transconductance, Gm), and one or more tunable capacitors, are coupled to a differential transmission line which serves as the inductance needed for the oscillator. Because the transmission line also inherently serves to distribute the clock signals, rather than generating the clock signals and then propagating them over a power-dissipating tree structure, the very structures that generate the clock signals also propagate those signals. Moreover, because transmission line oscillators are, by their nature, standing wave oscillators, any two clock signals, at whatever tap point along the transmission line oscillator, are synchronous, in-phase, and phase-locked.

By combining two or more transmission-line oscillators of suitable length, the clock signals can be propagated over any required distance. And because of the standing wave nature of transmission-line oscillators, the clock signal at any given moment will be the same at any of the tap points along the transmission line. That is, any two clock signals, at whatever tap point, are synchronous, in-phase, and phase-locked.

In a typical transmission-line oscillator, an oscillator core and tunable capacitor are coupled to a differential stub line which serves as an inductor. Normally, the distal ends of the stub line are short-circuited together and the electrical length of the stub line (which may be adjusted by the tunable capacitor) is one-quarter of the oscillator wavelength. In operation, this typical transmission-line oscillator exhibits a quarter-wavelength standing wave oscillation pattern.

In implementations of the subject matter of this disclosure, the basic distributed oscillator unit may be equivalent to two typical transmission-line oscillators with their differential quarter-wavelength stub lines connected end-to-end, creating a half-wavelength configuration. A full-wavelength configuration could be created in further implementations by coupling the two quarter-wave lines by an additional half-wavelength segment between the two quarter-wavelength lines. Switches are provided at the segment junctions in place of the electrical short in a typical quarter-wavelength oscillator. The impedance of the switches, which is higher than a short-circuit, allows strong coupling of the back-to-back oscillator structures and the selectable formation of nulls in the standing wave pattern, allowing the oscillation mode to be controlled, as described below.

More generally, the basic distributed oscillator unit may be thought of as two oscillator cores separated by a differential transmission line. Switches (e.g., CMOS transistors) distributed along the differential transmission line, that couple the two differential legs, may be used to divide the differential transmission line into segments and set up the oscillation mode. The relative physical lengths of the segments will change depending on which switches are closed, and the physical length of any segment generally will not be the same as the electrical length that determines the wavelength. Therefore, the basic distributed oscillator unit includes tunable capacitors not only near the ends at the oscillator cores, but also at one or more locations remote from the ends of the transmission line. The output clock signals may be sampled at the oscillator cores at the ends of the transmission line for maximum amplitude. More generally, the output may be sampled anywhere along the standing wave except at a null, but the amplitude may differ. According to the standing wave nature of operation of transmission line oscillators, the output clock at any given moment will be the same regardless of where it is sampled—all sampled clocks are synchronous, in-phase and phase-locked.

Each basic distributed oscillator unit may have a physical length of up to several millimeters. However, longer physical lengths, for clock distribution throughout a larger device, may be achieved by chaining together a plurality of the basic distributed oscillator units. Such a connection may be achieved, in some implementations, by parallel connection of the oscillator cores at the ends of the two adjacent basic distributed oscillator units. Other types of connections may also be used.

Alternatively, a single oscillator core may serve as the oscillator core for two different transmission line oscillators, forming the respective end of each of two different adjacent basic distributed oscillator units. That is, two different transmission line stubs may extend from a single oscillator core forming two different quarter-wavelength transmission line oscillators, and the distal end of a first one of those transmission line stubs may be coupled to a transmission line stub of a first other transmission line oscillator, while the distal end of a second one of those transmission line stubs may be coupled to a transmission line stub of a second other transmission line oscillator. Thus, the single oscillator core is shared by two basic distributed oscillator units—a first basic distributed oscillator unit formed by the single oscillator core, one of the two different transmission line stubs, and the oscillator core and transmission line stub of the first other transmission line oscillator, and a second basic distributed oscillator unit formed by the single oscillator core, the other of the two different transmission line stubs, and the oscillator core and transmission line stub of the second other transmission line oscillator. However, such a configuration is more difficult to implement because the connection of two transmission lines to a single oscillator core restricts access to the oscillator core for other connections such as power supply.

Chaining basic distributed oscillator units together not only provides longer clock distribution lines, but also decreases noise. By the nature of transmission line oscillators, coupling two transmission line oscillators together may decrease noise by up to 3 dB, depending on the nature of the coupling.

The subject matter of this disclosure may be better understood by reference to FIGS. 1-10.

Figure 1:
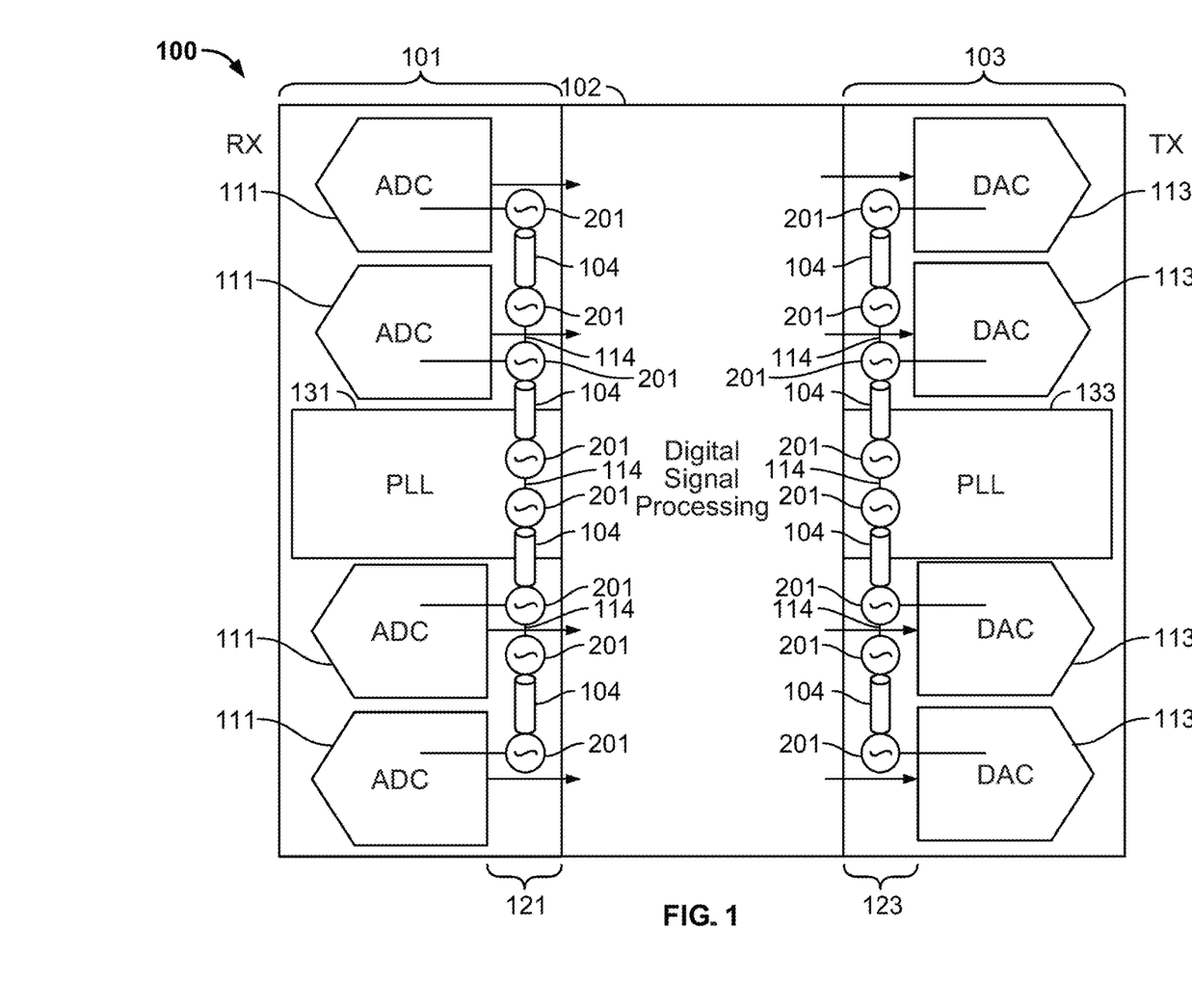
FIG. 1 shows an implementation of a four-channel coherent optical-to-optical repeater integrated circuit device incorporating the subject matter of this disclosure.

FIG. 1 shows an implementation of a four-channel coherent optical-to-optical repeater integrated circuit device 100. On the receiver side 101 of device 100, four analog-to-digital converters (ADCs) 111 receive electrical signals converted from optical signals, and digitize the signals for processing in digital signal processing circuitry 102, which outputs processed digital signals to four digital-to-analog converters (DACs) 113. DACs 113 convert the processed digital signals into analog signals for conversion to optical signals for outputting to the optical channel on transmit side 103. In this arrangement, each combination of a corresponding ADC 111 and DAC 113 may be thought of as a transceiver.

Each of receive side 101 and transmit side 103 is serviced by a respective separate distributed transmission line oscillator 121, 123. Each distributed transmission line oscillator 121, 123 includes a respective plurality of basic distributed oscillator units 104, chained together, as discussed above and described below. A respective phase-locked loop circuit 131, 133 may serve as a respective reference clock source.

Figure 2:
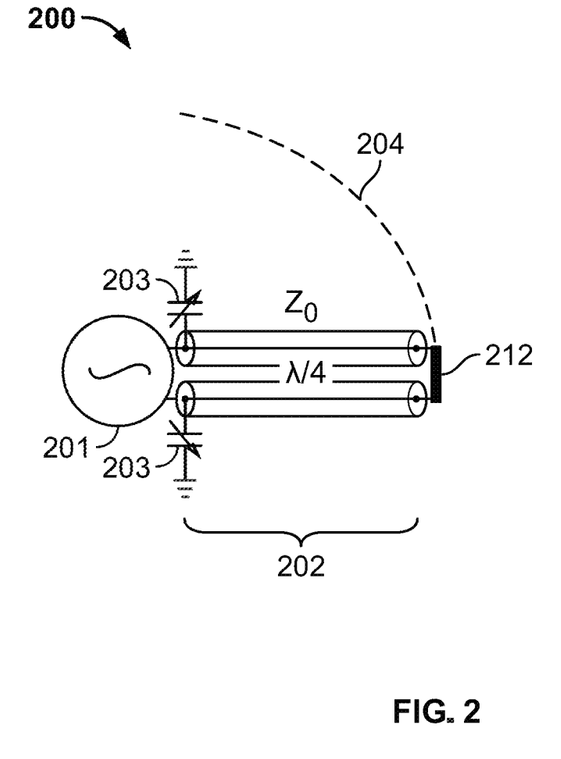
FIG. 2 is a schematic representation of a typical transmission line oscillator.

As seen in FIG. 2, a typical transmission line oscillator 200 includes a oscillator core 201, which may include a gain or transconductance (Gm) as described below, and a differential transmission line stub 202, with its ends short-circuited together at 212, which serves as the inductance (designated as impedance Zo in the drawing) for oscillator 200. This typical structure operates in a quarter-wavelength mode, generating a sinusoidal wave 204 whose wavelength is four times the stub length 222. Adjustable or tunable capacitors 203 between the respective legs of transmission line stub 202 and ground allow the electrical length of stub 202 to be varied from the physical length 222, providing control over the wavelength—and thus the frequency—of oscillator 200.

Figure 3:
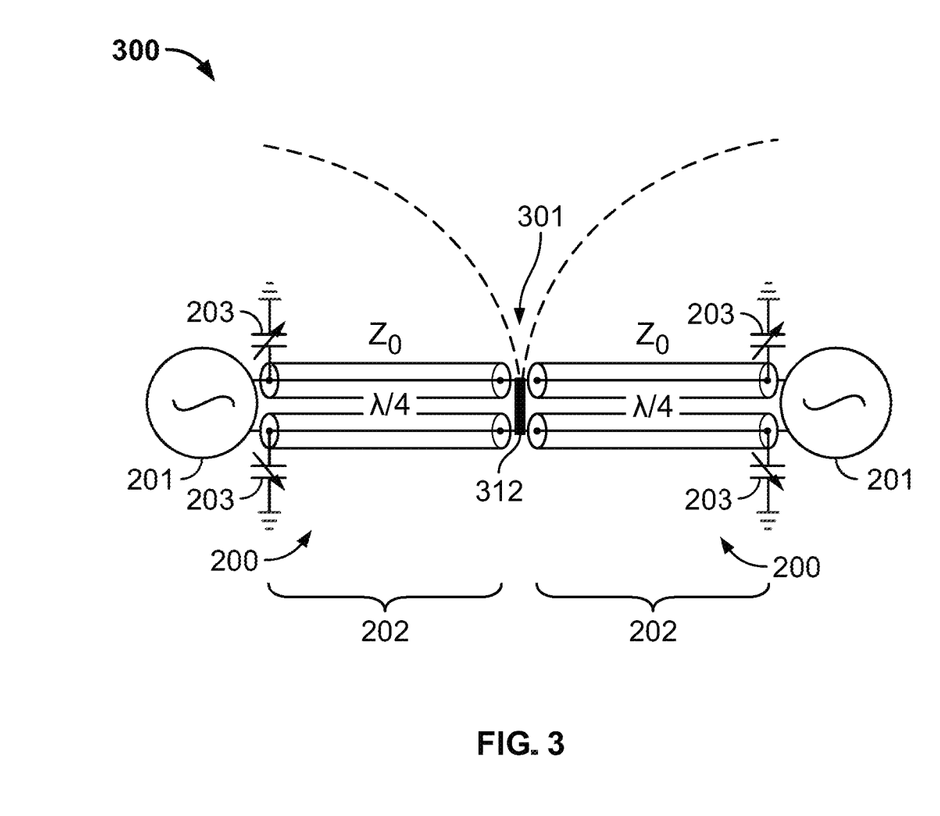
FIG. 3 shows a basic distributed oscillator unit according to an implementation of the subject matter of this disclosure.
Figure 4:
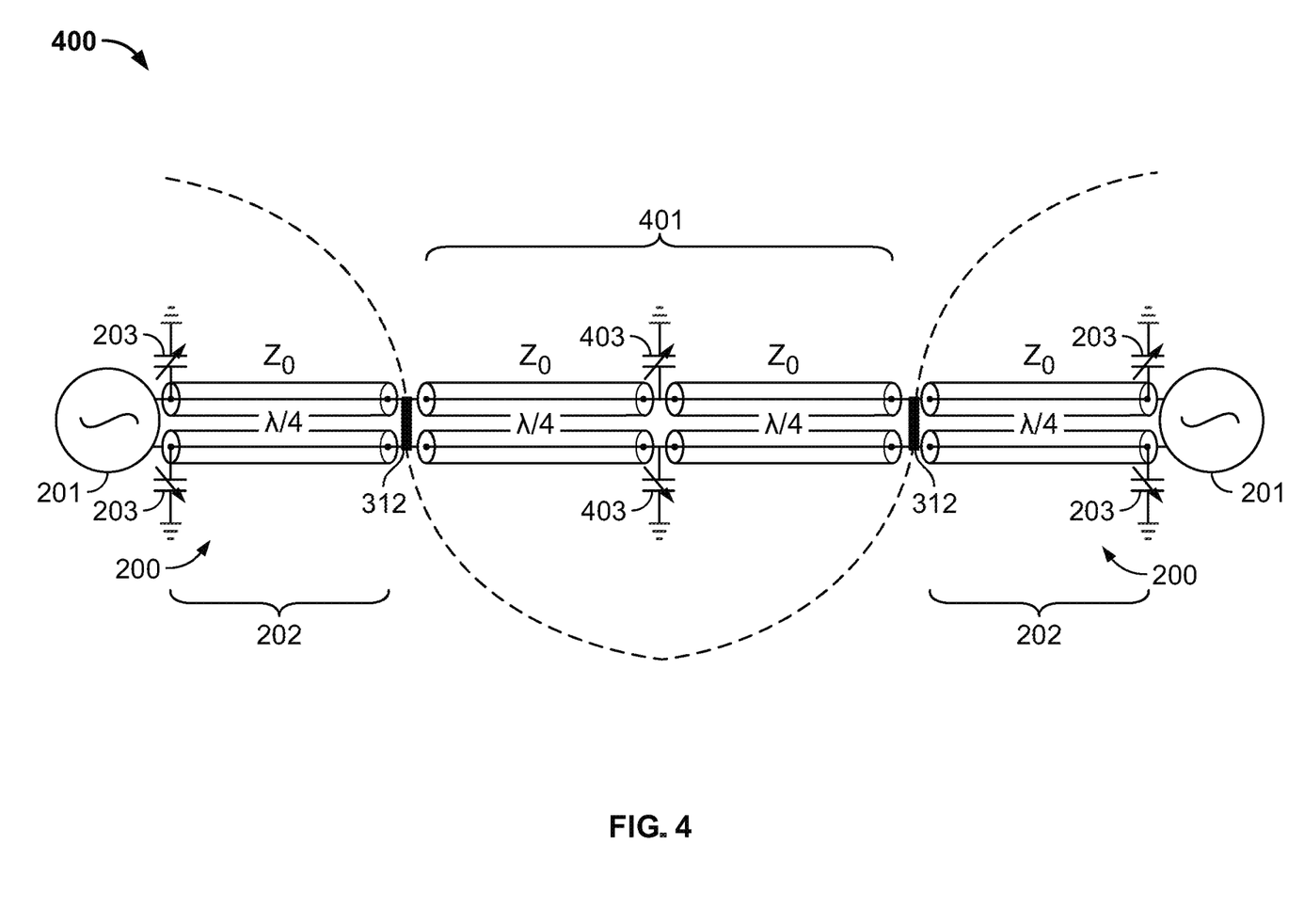
FIG. 4 shows a basic distributed oscillator unit according to another implementation of the subject matter of this disclosure.

A most basic distributed oscillator unit 300 according to implementations of the subject matter of this disclosure includes two of transmission line oscillator units 200 connected end-to-end at their respective transmission line ends, as shown in FIG. 3. The connection 312 (which in some implementations described below may be a switch) has a higher impedance than short circuit 212, thus allowing for strong coupling of the two back to back oscillator structures as described above. Such a structure, as shown, operates in a half-wavelength mode with a null 301 in the center. And as seen in FIG. 4, if instead of coupling the quarter-wavelength transmission line ends together directly, the quarter-wavelength transmission lines 202 are coupled by an intervening additional half-wavelength segment 401, a full wavelength implementation 400 of a basic distributed oscillator unit is formed. Additional adjustable or tunable capacitors 403 coupled to segment 401 again allow the electrical length of segment 401 to be adjusted relative to the physical length of segment 401, to control the wavelength, and therefore the frequency, of basic distributed oscillator unit 400.

Figure 5:
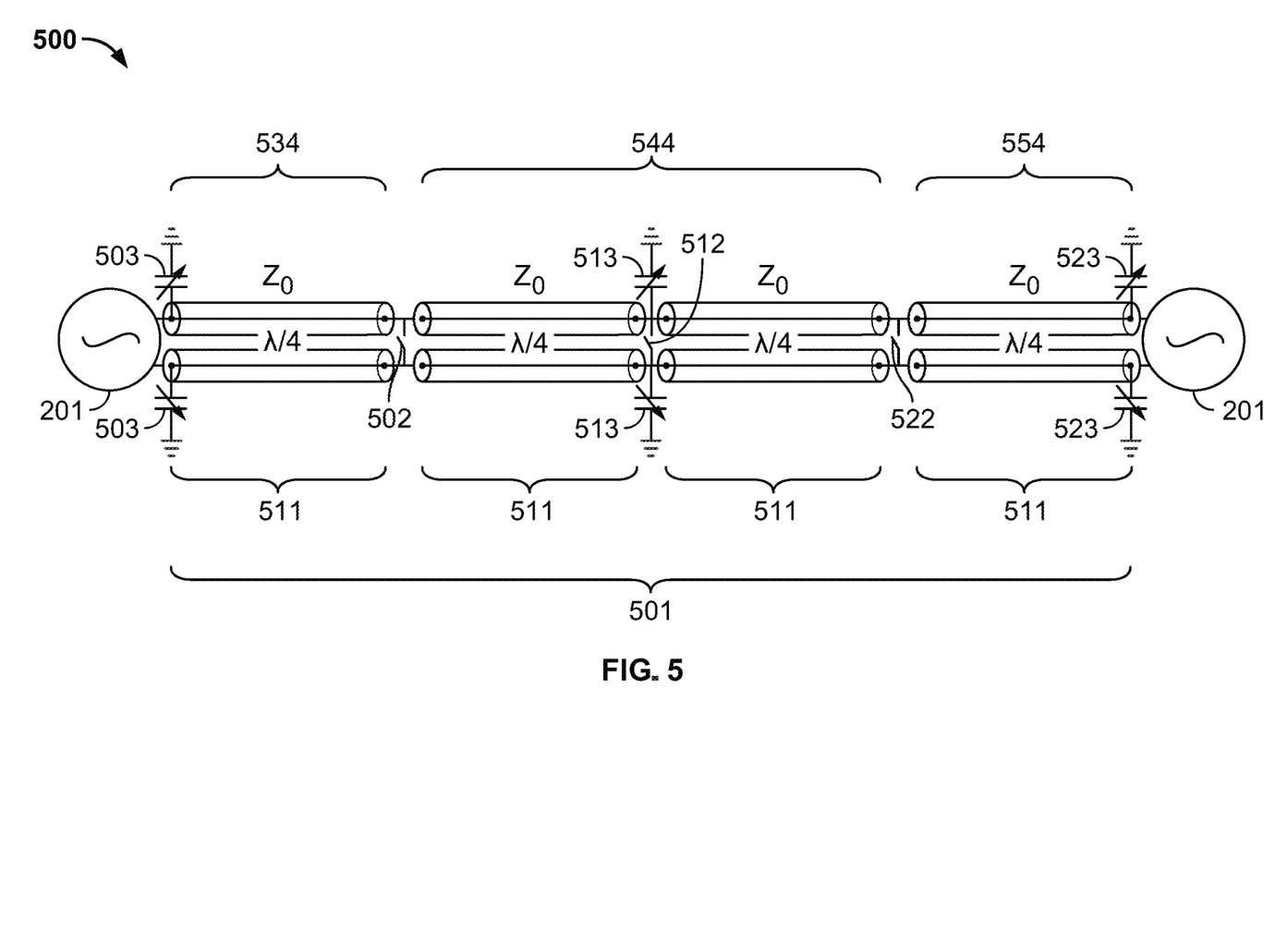
FIG. 5 shows a basic distributed oscillator unit according to a third implementation of the subject matter of this disclosure.

A more flexible implementation of a basic distributed oscillator unit 500 is shown in FIG. 5, where the full-wavelength transmission line 501 is provided in four quarter-wavelength segments 511, and at the junctions between the various segments 511, switches 502, 512, 522 may be provided. Although shown as simple switches, switches 502, 512, 522 may be implemented as transistor switches (e.g., MOSFETs) that, when "closed" do not present a true short circuit, but rather retain some impedance, while nevertheless encouraging the formation of a null in a standing wave along transmission line 501. To provide the reflections that give rise to the nulls, each transistor switch should have an impedance between about 25% and about 100% of the transmission line. For a 40 ohm transmission line, each of the transistor switches, when fully "closed," should have an impedance between about 8 ohms and about 25 ohms.

Basic distributed oscillator unit 500 may be operated in different modes depending on the positions of switches 502, 512, 522. Although switches 502, 512, 522 are all shown as open in FIG. 5, different ones of switches 502, 512, 522 may be closed to provide different modes of operation, as follows.

For example, in one mode, switch 512 in the center may be closed, while switches 502, 522 are left open, resulting in a half-wavelength mode with a null in the center, similar to that of FIG. 3. In this mode, tunable capacitors 513 serve no purpose, while tunable capacitors 503, 523 set the electrical lengths of the two effective quarter-wavelength segments 504, 514.

In another mode, switch 512 in the center may be left open, while switches 502, 522 are closed, resulting in a full-wavelength mode with nulls at the quarter-wavelength positions, similar to that of FIG. 4. In this mode, tunable capacitors 513 set the electrical length of the central half-wavelength segment 544, while tunable capacitors 503, 523 set the electrical lengths of the two effective quarter-wavelength segments 534, 554.

Figure 6:
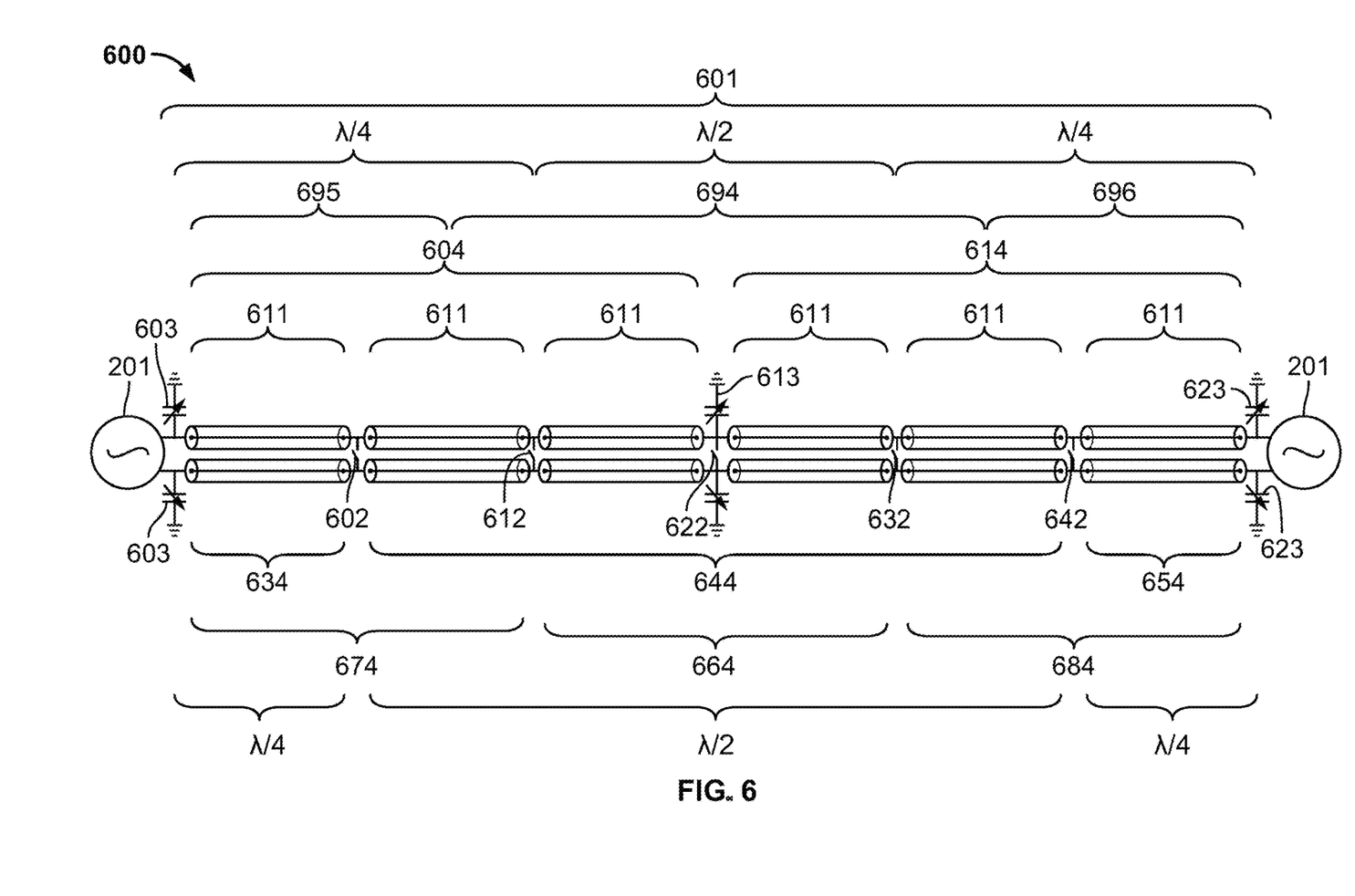
FIG. 6 shows a basic distributed oscillator unit according to a fourth implementation of the subject matter of this disclosure.

An even more flexible implementation of a basic distributed oscillator unit 600 is shown in FIG. 6, where the full-wavelength transmission line 601 is provided in six segments 611, and at the junctions between the various segments 611, switches 602, 612, 622, 632, 642 may be provided. Like switches 502, 512, 522, switches 602, 612, 622, 632, 642 may be implemented as transistor switches (e.g., MOSFETs) that, when "closed" do not present a true short circuit, but rather retain some impedance, while nevertheless encouraging the formation of a null in a standing wave along transmission line 601.

Basic distributed oscillator unit 600 may be operated in different modes. For example, as in the case of basic distributed oscillator unit 500, in one mode, switch 622 in the center may be closed, while switches 602, 612, 632, 642 are left open, resulting in a half-wavelength mode with a null in the center, similar to that of FIG. 3. In this mode, tunable capacitors 613 serve no purpose, while tunable capacitors 603 set the electrical length of the effective quarter-wavelength segment 604, and tunable capacitors 623 set the electrical length of the effective quarter-wavelength segment 614.

Basic distributed oscillator unit 600 may have three different full-wavelength modes.

In a first full-wavelength mode, switch 622 in the center, along with switches 612 and 632, may be left open, while switches 602, 642 are closed, resulting in a full-wavelength mode with nulls at the positions of switches 602, 642. In this mode, tunable capacitors 613 set the electrical length of the central half-wavelength segment 644, while tunable capacitors 603, 623 set the electrical lengths of the two effective quarter-wavelength segments 634, 654.

In a second full-wavelength mode, switch 622 in the center, along with switches 602 and 642, may be left open, while switches 612, 632 are closed, resulting in a full-wavelength mode with nulls at the positions of switches 612, 632. In this mode, tunable capacitors 613 set the electrical length of the central half-wavelength segment 664, while tunable capacitors 603 set the electrical length of effective quarter-wavelength segment 674, and tunable capacitors 623 set the electrical length of effective quarter-wavelength segment 684.

In a third full-wavelength mode, switch 622 in the center may be left open, while switches 612, 632, 632, 642 are all closed, resulting in a full-wavelength mode with a null at an interpolated position (generally halfway) between switches 602 and 612, and another null at an interpolated position (generally halfway) between switches 632 and 642. In this mode, tunable capacitors 613 set the electrical length of the central half-wavelength segment 694, while tunable capacitors 603 and 623 set the electrical lengths of effective quarter-wavelength segments 695, 696, respectively.

As discussed above, multiple basic distributed oscillator units as described in FIGS. 4-6 may be chained together to provide a longer transmission-line oscillator to distribute a synchronous, in-phase, phase-locked clock over a large device. As shown in FIG. 1, each basic distributed oscillator unit may have a respective oscillator core 201 at each end, with a simple parallel connection 114 between adjacent oscillator cores 201 of two adjacent basic distributed oscillator units 104. Parallel connection 114 may be a passive connection as shown, or may be an active connection including, for example, inverting or non-inverting buffers.

Figure 7:
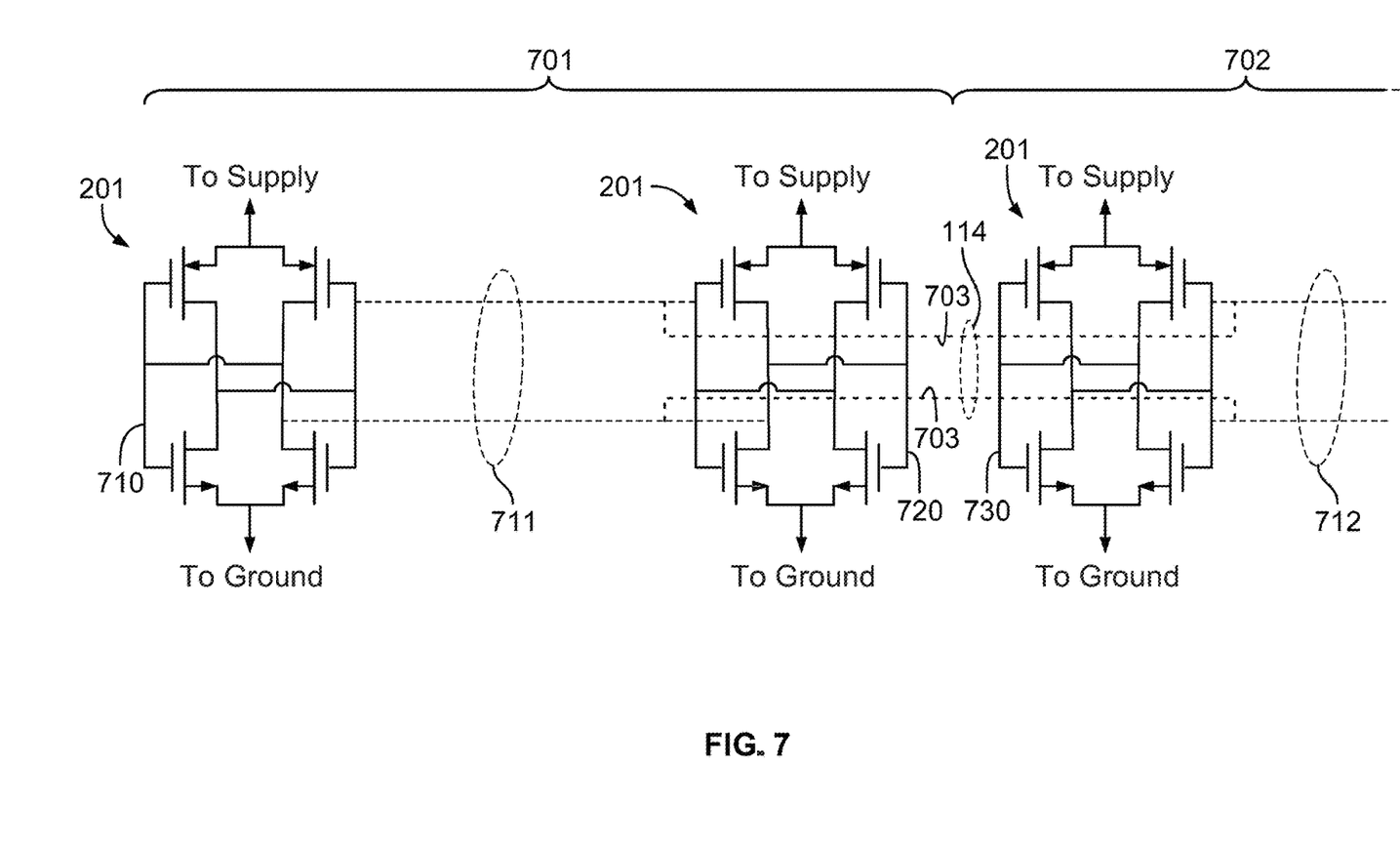
FIG. 7 shows an implementation of an interconnection between two basic distributed oscillator units according to the subject matter of this disclosure.

FIG. 7 shows such a connection in more detail, between a basic distributed oscillator unit 701 and a partial additional basic distributed oscillator unit 702. Basic distributed oscillator unit 701 includes two oscillator cores 201 connected by transmission line 711, while one oscillator core 201, and a portion of transmission line 712, of basic distributed oscillator unit 702, are shown. Oscillator core 201 may have any VCO transconductance type gain structure, such as the four transistor arrangement 710, 720, 730 shown here. Parallel connection 114 may be passive, including simple conductors 703 interconnecting transmission line 711 and transmission line 712 as shown, or, as noted above, may be an active connection including, for example, inverting or non-inverting buffers.

Figure 8:
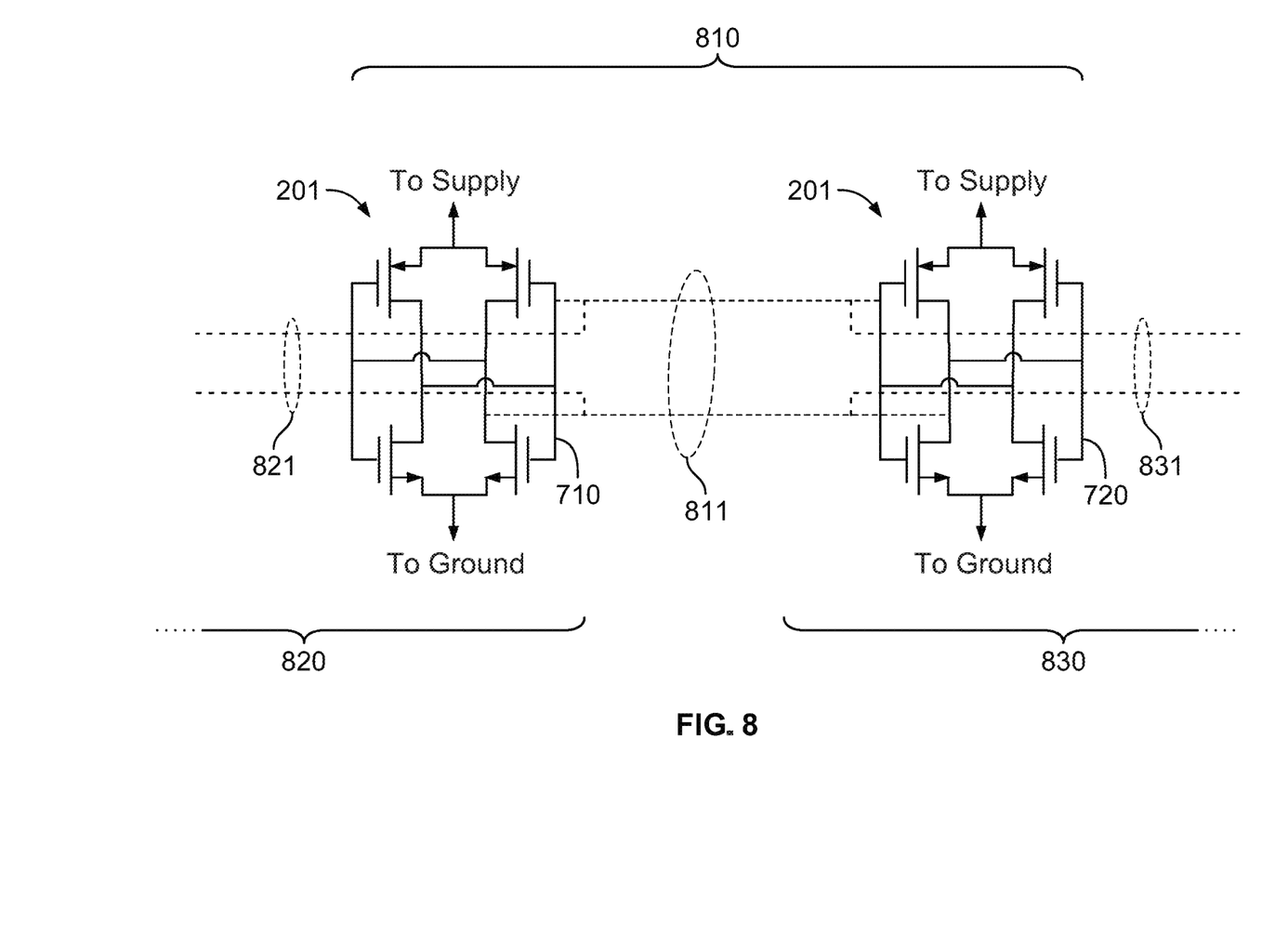
FIG. 8 shows another implementation of an interconnection between two basic distributed oscillator units according to the subject matter of this disclosure.

Alternatively, as shown in FIG. 8, each oscillator core 201 may be part of two different adjacent basic distributed oscillator units 702. Thus, basic distributed oscillator unit 810 may include oscillator core 710 and oscillator core 720, with transmission line 811 between them, but oscillator core 710 may also be part of basic distributed oscillator unit 820 including transmission line 821 and another unseen oscillator core, and oscillator core 720 may also be part of basic distributed oscillator unit 830 including transmission line 831 and another unseen oscillator core. In this implementation, the connection between adjacent basic distributed oscillator units is one of the oscillator cores itself. However, this implementation may be difficult to implement in an integrated circuit device because connection to two different transmission lines may interfere with other connections such as power supply and control connections. However, the subject matter of this disclosure may also be implemented in MMIC devices using printed circuit boards and discrete components, where an arrangement as shown in FIG. 8 may be more feasible.

Figure 9:
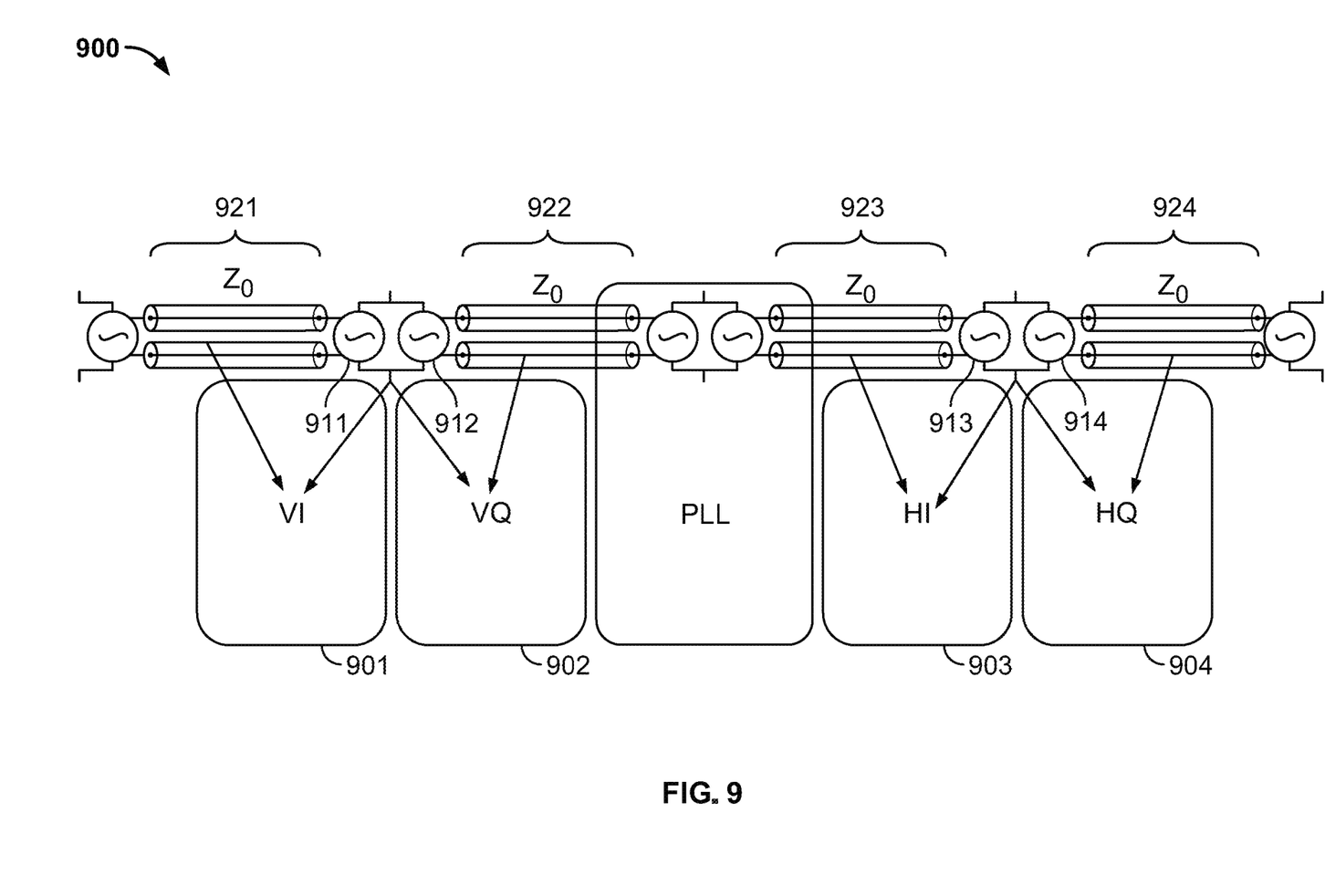
FIG. 9 shows how a transmission-line oscillator including multiple basic distributed oscillator units according to implementations of the subject matter of this disclosure may provide clock signals for different channels of a device.

As shown in FIG. 9, using a transmission-line oscillator 900 including multiple basic distributed oscillator units, it may be possible to tap off the oscillator in multiple locations to provide clock signals for different channels of a device. Thus, a clock signal for channel 901 may be provided by tapping oscillator core 911 and transmission line 921, while a clock signal for channel 902 may be provided by tapping oscillator core 912 and transmission line 922. Similarly, a clock signal for channel 903 may be provided by tapping oscillator core 913 and transmission line 923, while a clock signal for channel 904 may be provided by tapping oscillator core 914 and transmission line 924.

As noted above, the standing wave nature of transmission line oscillators makes clock outputs all along a transmission-line oscillator such as transmission-line oscillator 900 are synchronous, in-phase and phase-locked, thus reducing clock jitter across the device. Moreover, because of the nature of transmission-line oscillators, noise is reduced for each additional basic distributed oscillator unit coupled into the transmission-line oscillator, further reducing jitter. Each doubling of the number of oscillator units may reduce noise by up to 3 dB.

Figure 10:
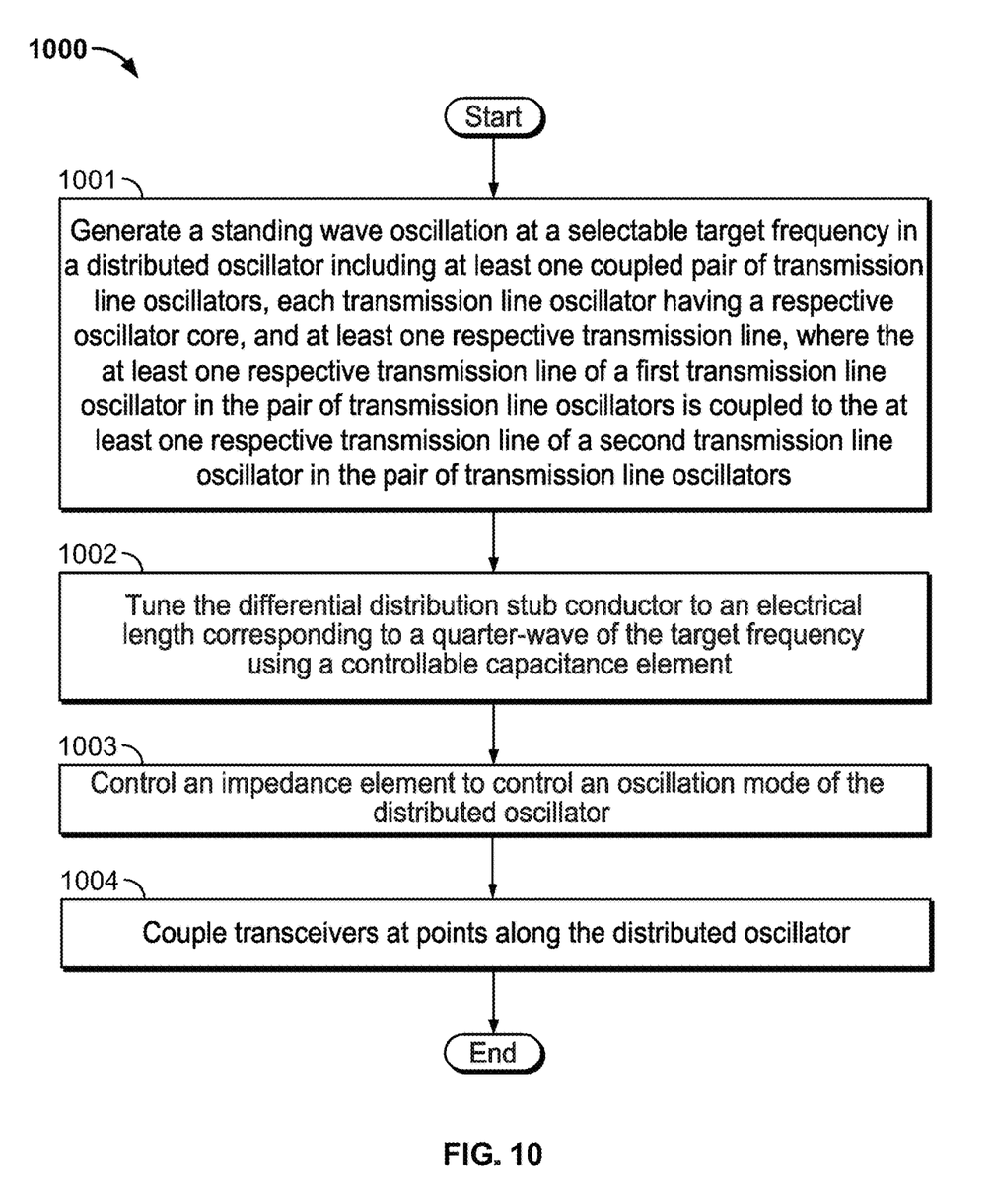
FIG. 10 is a flow diagram illustrating implementations of a method in accordance with the subject matter of this disclosure.

A method of distributing synchronous, in-phase, phase-locked clock signals to transceivers in a multi-transceiver integrated circuit device in accordance with implementations of the subject matter of this disclosure is diagrammed in FIG. 10. Method 1000 begins at 1001 where a standing wave oscillation is generated at a selectable target frequency in a distributed oscillator including at least one coupled pair of transmission line oscillators, each transmission line oscillator having a respective oscillator core, and at least one respective transmission line, where the at least one respective transmission line of a first transmission line oscillator in the pair of transmission line oscillators is coupled to the at least one respective transmission line of a second transmission line oscillator in the pair of transmission line oscillators.

At 1002, the at least one respective transmission line is tuned to an electrical length corresponding to a quarter-wave of the target frequency using a controllable capacitance element. At 1003, an impedance element is controlled to control an oscillation mode of the distributed oscillator. At 1004, the transceivers are coupled at points along the distributed oscillator, and method 1000 ends.

Thus it is seen that transmission line oscillators to deliver synchronous, in-phase, phase-locked clock signals to all transceivers of a multi-transceiver integrated circuit device have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit transceiver device comprising:
a plurality of functional circuits of the integrated circuit transceiver device, each functional circuit being disposed at a different spatial location of the integrated circuit transceiver device; and
clock circuitry for distributing synchronous, in-phase, phase-locked clock signals to all functional circuits in the plurality of functional circuits, the clock circuitry comprising:
a frequency-controllable distributed oscillator configured to generate a clock signal, the distributed oscillator including:
at least one coupled pair of transmission line oscillators, each transmission line oscillator having a respective oscillator core, and at least one respective transmission line segment;
at least one impedance element coupling the at least one respective transmission line segment of a first transmission line oscillator in the pair of transmission line oscillators to the at least one respective transmission line segment of a second transmission line oscillator in the pair of transmission line oscillators, impedance of the at least one impedance element being different from impedance of each of the at least one respective transmission line segment to cause reflection at the at least one impedance element, the at least one impedance element comprising a plurality of independently controllable switches, each respective independently controllable switch being configured to selectably establish at its respective location, when closed, a null in a standing wave of its respective transmission line oscillator to control an oscillation mode of its respective transmission line oscillator; and at least one tap corresponding to each respective one of the transmission line oscillators, each tap being configured to output synchronous, in-phase, phase-locked clock signals for the functional circuits at points along the distributed oscillator.

2. The integrated circuit transceiver device of claim 1 further comprising a respective controllable capacitance element configured to tune each respective transmission line segment to a respective electrical length corresponding to a quarter-wave of a target frequency.

3. The integrated circuit transceiver device of claim 1 wherein:
the at least one respective transmission line segment comprises at least one additional transmission line segment; the integrated circuit transceiver device further comprising:
a respective additional impedance element coupling each additional transmission line segment to an adjacent transmission line segment in the pair of transmission line oscillators.

4. The integrated circuit transceiver device of claim 3 wherein each coupled pair of transmission line oscillators further comprises a respective additional controllable capacitance element configured to tune a respective additional transmission line segment to an electrical length corresponding to a selectable fractional portion of a wavelength corresponding to the target frequency.

5. The integrated circuit transceiver device of claim 1 wherein each coupled pair of transmission line oscillators further comprises a midpoint switch at a midpoint between the respective oscillator cores of the transmission line oscillators in the coupled pair of transmission line oscillators, the midpoint switch being configured to controllably establish, when closed, a null in a standing wave of the coupled pair of transmission line oscillators to control an additional oscillation mode of the coupled pair of transmission line oscillators.

6. The integrated circuit transceiver device of claim 1 wherein the plurality of switches in each transmission line oscillator in the pair of transmission line oscillators are configured to controllably establish, when two adjacent ones of the plurality of switches are closed, the null in the standing wave of the respective transmission line oscillator at an interpolated position between the two adjacent ones of the switches.

7. The integrated circuit transceiver device of claim 1 wherein:
the distributed oscillator comprises a plurality of coupled pairs of transmission line oscillators, each of the coupled pairs of transmission line oscillators being chained to an adjacent one of the coupled pairs of transmission line oscillators at one of its oscillator cores; and
the taps are configured at oscillator cores in the distributed oscillator to output the synchronous, in-phase, phase-locked clock signals.

8. The integrated circuit transceiver device of claim 7 wherein output of each respective coupled pair of transmission line oscillators is directed to a respective channel of the integrated circuit transceiver device.

9. The integrated circuit transceiver device of claim 7 wherein each oscillator core that is at an end of a first coupled pair of transmission line oscillators that is adjacent an end of a second coupled pair of transmission line oscillators is coupled to an oscillator core in the second coupled pair of transmission line oscillators.

10. The integrated circuit transceiver device of claim 7 wherein each oscillator core that is at an end of a first coupled pair of transmission line oscillators that is adjacent an end of a second coupled pair of transmission line oscillators is part of the first coupled pair of transmission line oscillators and of the second coupled pair of transmission line oscillators.

11. A method of distributing synchronous, in-phase, phase-locked clock signals to functional circuits in an integrated circuit transceiver device, the method comprising:
generating a standing wave oscillation at a selectable target frequency in a distributed oscillator including at least one coupled pair of transmission line oscillators, each transmission line oscillator having a respective oscillator core, and at least one respective transmission line, where the at least one respective transmission line of a first transmission line oscillator in the pair of transmission line oscillators is coupled by at least one impedance element to the at least one respective transmission line of a second transmission line oscillator in the pair of transmission line oscillators;
tuning the at least one respective transmission line to an electrical length corresponding to a quarter-wave of the target frequency using a controllable capacitance element;
controlling the at least one impedance element to control an oscillation mode of the distributed oscillator, by closing one or more switches among a plurality of switches to establish one or more nulls in a standing wave of the coupled pair of transmission line oscillators at locations determined by the one or more switches; and
coupling the functional circuits to taps at points along the distributed oscillator.

12. The method of distributing synchronous, in-phase, phase-locked clock signals according to claim 11, further comprising:
coupling at least one additional transmission line segment between the at least one transmission line segment of the first transmission line oscillator in the pair of transmission line oscillators and the at least one transmission line segment of the second transmission line oscillator in the pair of transmission line oscillators; and
tuning the transmission line segments to an electrical length corresponding to a selectable fractional portion of a wavelength corresponding to the target frequency.

13. The method of distributing synchronous, in-phase, phase-locked clock signals according to claim 11, wherein:
closing the one or more switches comprises closing at least two switches among the plurality of switches to establish a null in a standing wave of the coupled pair of transmission line oscillators at an interpolated location between locations of the two switches among the plurality of switches.

14. The method of distributing synchronous, in-phase, phase-locked clock signals according to claim 11, wherein:
controlling the at least one impedance element to control an oscillation mode of its respective transmission line oscillator further comprises:
closing a switch at a midpoint between the respective oscillator cores of the transmission line oscillators in the coupled pair of transmission line oscillators, to establish a null, located at the midpoint, in a standing wave of the coupled pair of transmission line oscillators.

15. The method of distributing synchronous, in-phase, phase-locked clock signals according to claim 11, further comprising chaining a plurality of coupled pairs of transmission line oscillators, each of the coupled pairs of transmission line oscillators being chained to an adjacent one of the coupled pairs of transmission line oscillators at one of its oscillator cores.

16. The method of distributing synchronous, in-phase, phase-locked clock signals according to claim 15, further comprising directing output of each respective coupled pair of transmission line oscillators to a respective channel of the integrated circuit transceiver device.

\* \* \* \* \*